United States Patent [19]

Nishizawa et al.

[11] Patent Number: 4,984,049
[45] Date of Patent: Jan. 8, 1991

[54] STATIC INDUCTION THYRISTOR

[75] Inventors: Jun-ichi Nishizawa; Tadahiro Ohmi, both of Sendai; Yoshinobu Ohtsubo, Yokohama, all of Japan

[73] Assignees: Zaidan Hozin Handotai Kenkyu Shinkokai; Toyo Denki Seizo Kabushiki Kaisha, Japan

[21] Appl. No.: 215,037

[22] Filed: Jul. 5, 1988

Related U.S. Application Data

[63] Continuation of Ser. No. 888,577, Jul. 21, 1986, which is a continuation of Ser. No. 403,635, Jul. 20, 1982.

[30] Foreign Application Priority Data

Nov. 21, 1980 [JP] Japan ................................. 55-163382

[51] Int. Cl.$^5$ ..................... H01L 29/74; H01L 29/06
[52] U.S. Cl. ........................................ 357/38; 357/20; 357/55
[58] Field of Search ................. 357/38, 20, 55

[56] References Cited

U.S. PATENT DOCUMENTS

| | | | |
|---|---|---|---|
| 4,086,611 | 4/1978 | Nishizawa et al. | 357/38 |
| 4,170,019 | 10/1979 | Hysell et al. | 357/88 X |
| 4,171,995 | 10/1979 | Nishizawa et al. | 357/38 |
| 4,198,645 | 4/1980 | Nishizawa | 357/38 |
| 4,223,328 | 9/1980 | Terasawa et al. | 357/20 X |
| 4,364,072 | 12/1982 | Nishizawa | 357/38 |

Primary Examiner—Rolf Hille
Assistant Examiner—Wael Fahmy
Attorney, Agent, or Firm—Silverman, Cass & Singer, Ltd.

[57] ABSTRACT

A static induction thyristor having a mesh like gate region in front of the cathode, and between the gate region and the cathode a high resistance region having effective impurity concentration of $10_{11}$ $cm^{-3} - 5 \times 10^{14}$ $cm^{-3}$ is interposed, and the voltage gain decided by the gate length, gate interval and the gate-to-anode distance is made 10 or more so that the forward voltage drop is small, providing high speed switching ability and a large reverse breakdown voltage.

32 Claims, 19 Drawing Sheets

FIG._1a
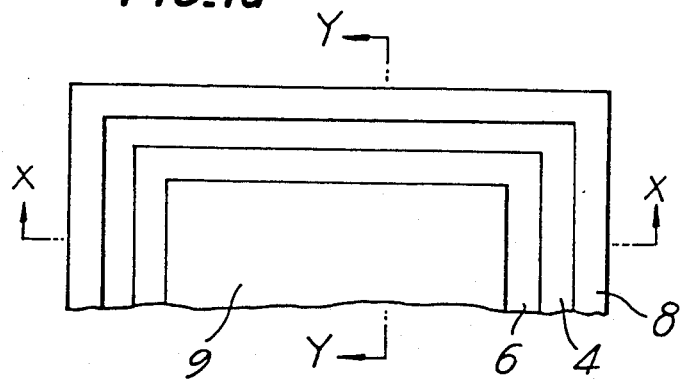
FIG._1b
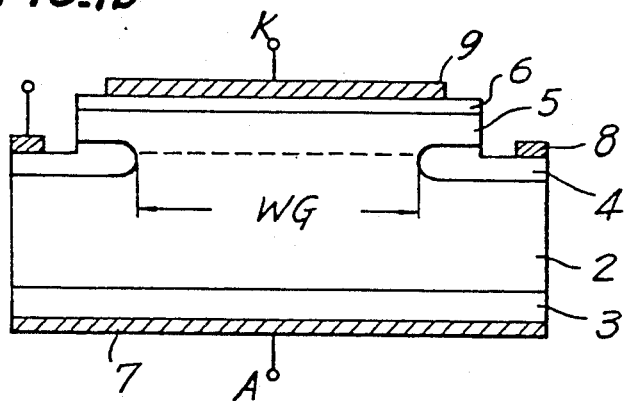
FIG._1c
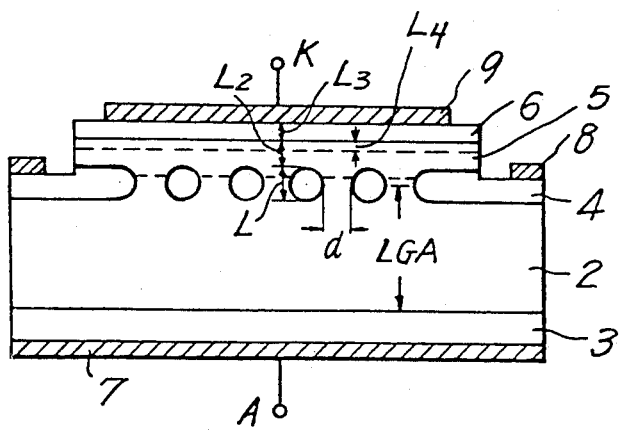

FIG_11a
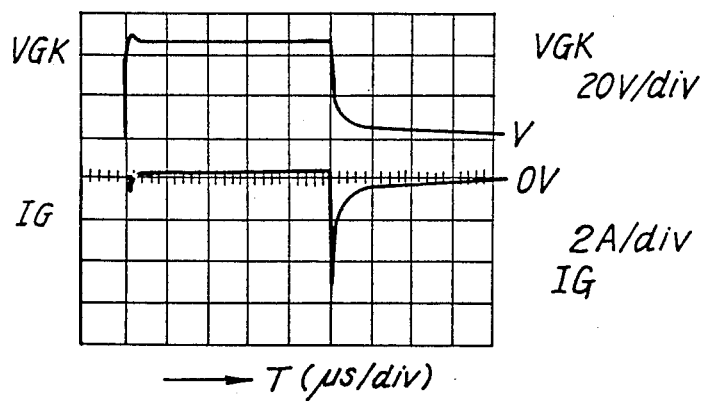
FIG_11b
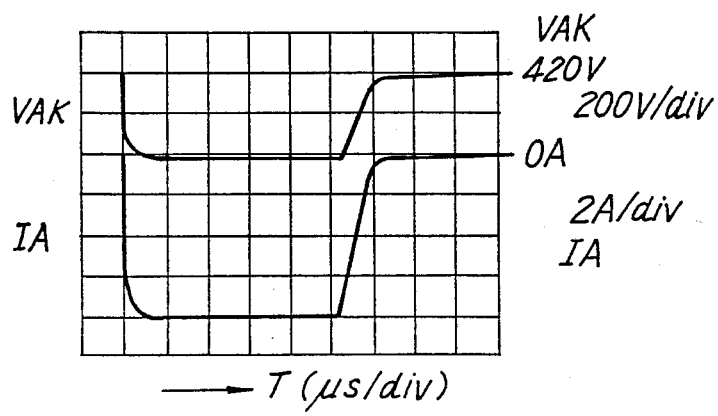

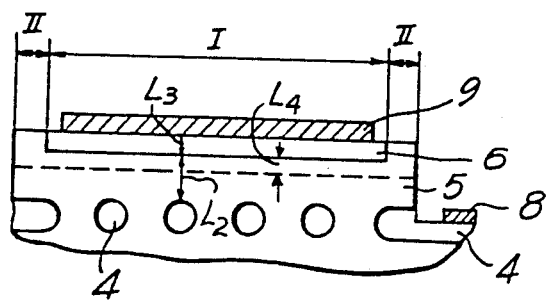
FIG_14
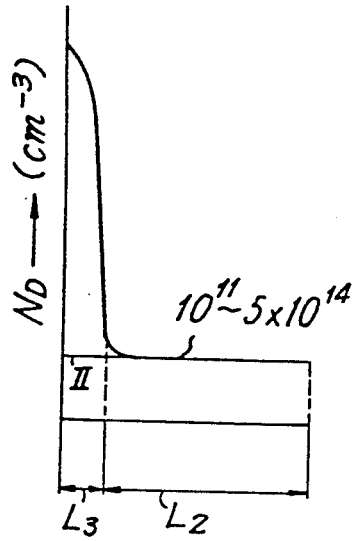
FIG_15
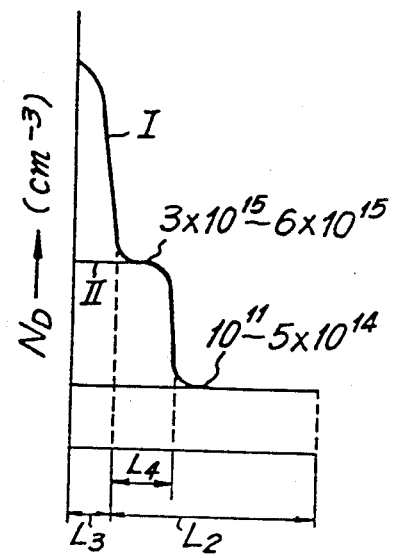
FIG_16

FIG_19a
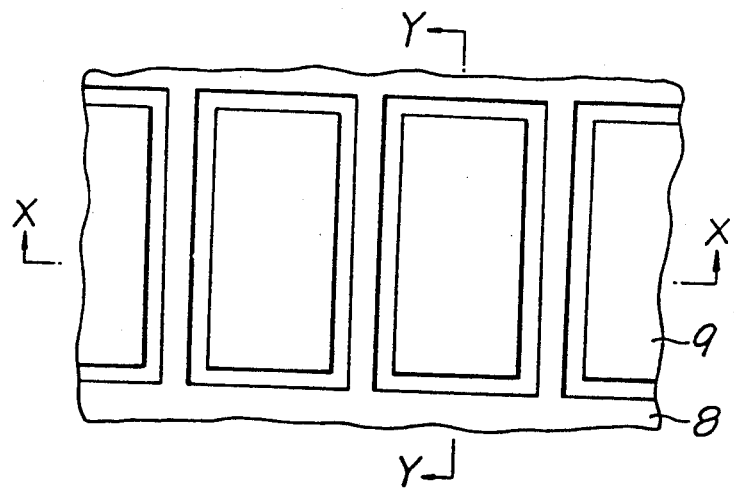
FIG_19b
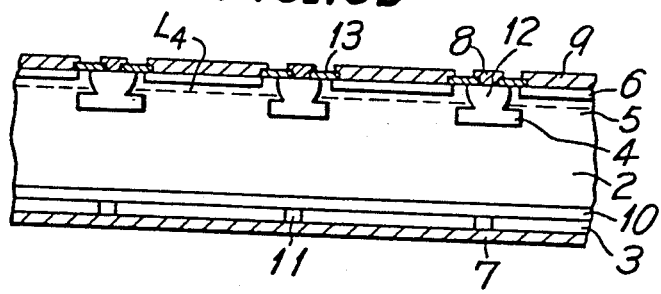
FIG_19c
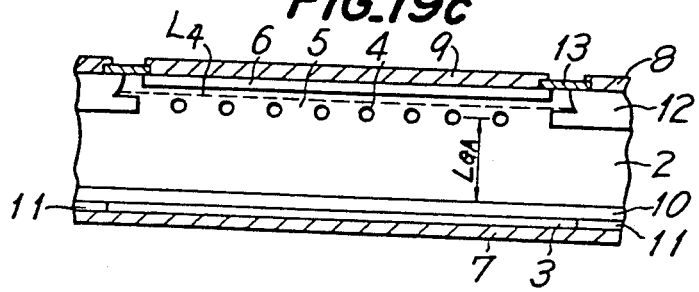

FIG_20
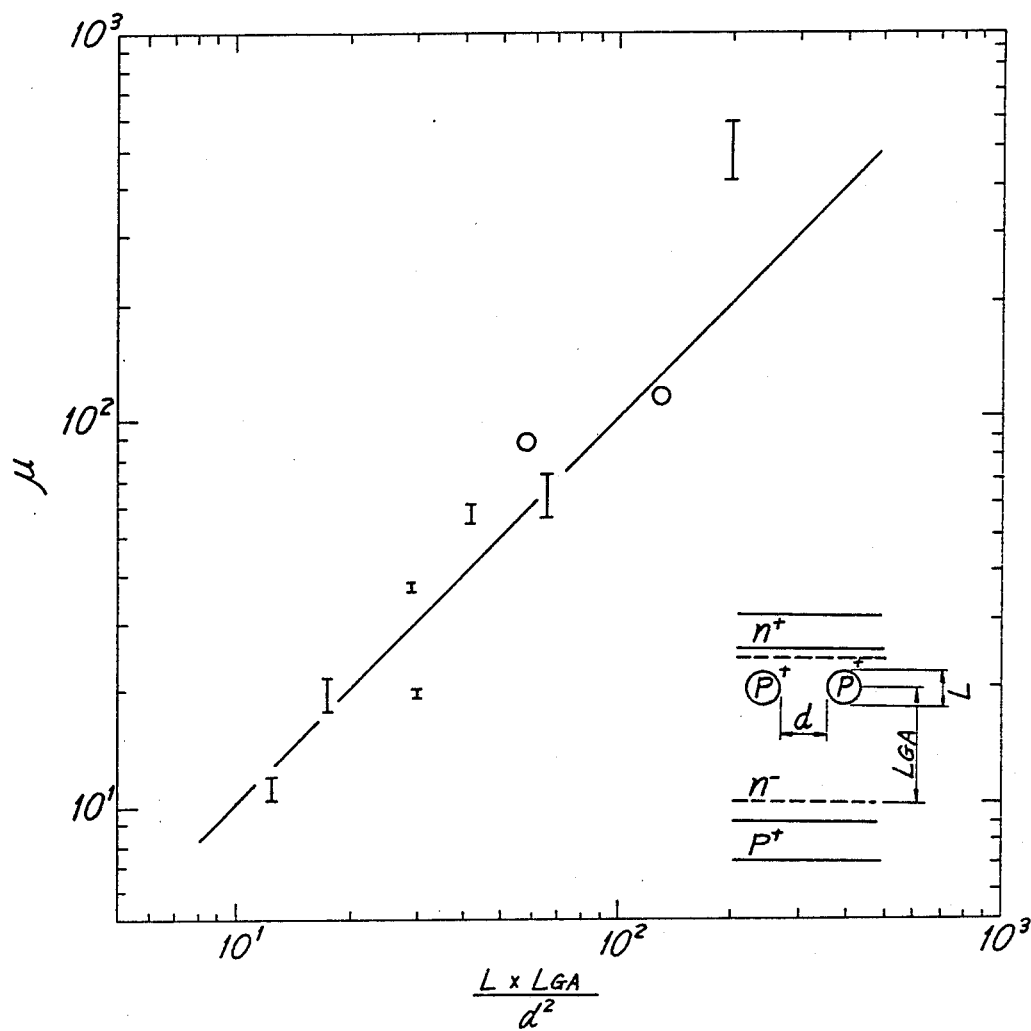

FIG_22
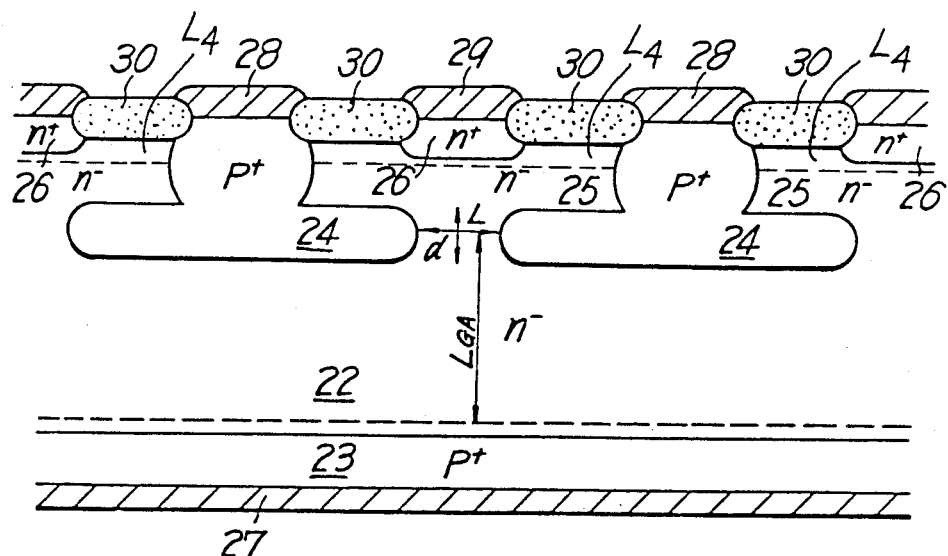
FIG_23
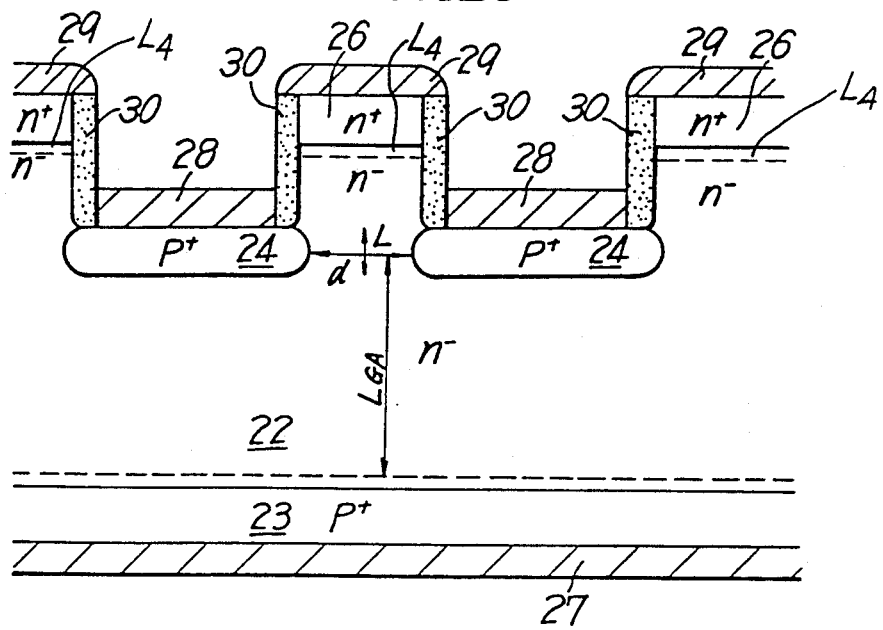

STATIC INDUCTION THYRISTOR

This is a continuation of application Ser. No. 888,577 filed July 21, 1986, which is a continuation of application Ser. No. 403,635 filed on July 20, 1982.

TECHNICAL FIELD

The present invention relates to a static induction thyristor having low ON voltage and high voltage gain and also having large turn-off current.

BACKGROUND ART

Conventional static induction thyristors (hereinafter referred to as SI thyristor) formed in diode construction provided with a gate have self turn-off function by which the main current can be interrupted by the gate. However, the voltage drop in the ON condition (hereinafter called as ON voltage) is high and the voltage gain is low. Thus, there are several points to be improved in its characteristics. A method for decreasing the ON voltage has not been established as far as the inventors had confirmed so far.

DISCLOSURE OF INVENTION

The present invention has for its object to realize an improved SI thyristor having low ON voltage, high voltage gain, i.e. having large forward direction off-state voltage by a small gate voltage, and having large gate turn-off current, i.e. having large main current being able to cut-off by the gate, and having high reverse direction gate to cathode breakdown voltage.

BRIEF EXPLANATION OF DRAWING

FIGS. 1a, 1b and 1c are partial plan view and cross-sectional views for showing one embodiment of a buried gate static induction thyristor, respectively;

FIGS. 10a, 10b and 11a, 11b are diagrams for showing typical switching waveforms;

FIGS. 14 to 16 are explanatory diagrams for showing construction of one embodiment of the static induction thyristor of the present invention;

FIGS. 19a, 19b and 19c are diagrams for showing construction of a different embodiment of the static induction thyristor of the present invention;

FIG. 20 is a diagram for showing the relationship between the voltage gain $\mu$ and the construction of said static induction thyristor;

FIGS. 22 to 24 are explanatory diagrams of still further embodiment of the present invention;

BEST MODE OF CARRYING OUT THE INVENTION

Figure 2A:
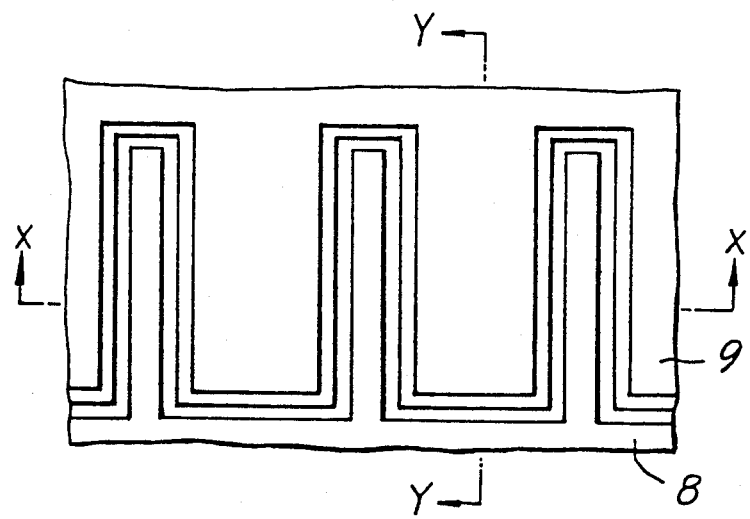
FIGS. 2a, 2b and 2c are partial plan view and cross-sectional views for showing one embodiment of a static induction thyristor according to the present invention respectively.

The invention will be explained hereinafter by referring to the drawings.

FIGS. 1a, 1b and 1c show one embodiment of buried gate static induction thyristor in plan view, front view and side view, respectively.

In FIGS. 1a to 1c, 2 is an n-type silicon substrate, 3 is a p-type region, 4 is a p-type gate region, 5 is an n-type region, and 6 is an n-type low resistance region. Furthermore, to the p-type region 3, an anode electrode 7 is connected, and likewisely a gate electrode 8 is connected to the p-type gate region and a cathode electrode 9 is connected to the n-type low resistance region.

In an SI thyristor, by applying suitable reverse direction gate voltage $V_{GK}$ between the gate electrode 8 and cathode electrode 9, the forward direction anode voltage $V_{AK}$ applied between the anode electrode 7 and the cathode electrode 9 is overcome and the thyristor becomes OFF condition. The voltage ratio $V_{AK}/|V_{GK}|$ at this time is defined as the voltage gain. On the other hand, either by removing the reverse bias voltage between the gate electrode 8 and the cathode electrode 9 or by applying a forward bias thereto, anode electrode 7 to cathode electrode 9 path becomes ON condition in which the forward current easily flows and an ON voltage is produced.

In general, in an SI thyristor, the following are desirable.

(1) ON voltage should be small.
(2) Voltage gain should be large.
(3) Gate turn-off current should be large, and some others.

However, conventional SI thyristors have comparatively high ON voltage. Therefore, when we consider the effective impurity concentration (hereinafter called simply as impurity concentration) $N_D$ and the ON voltage in the n-type region between the gate and the cathode, it can be said experimentally that the ON voltage is small for smaller impurity concentration. This can be understood from the fact that the electron injection efficiency from the n-type low resistance region 6 and the hole injection efficiency from the p-type region 3 at ON condition are high resulting from small impurity concentration $N_D$ in the n-type region.

When the impurity concentration in the n-type region 5 between the gate and the cathode is made small, inevitably an effect is obtained in that the voltage gain becomes high and the switching speed becomes high. Since the junction capacity between the gate and the cathode becomes smaller for smaller impurity concentration in the n-type region 5, the time constant rg.$C_{GK}$ decreases when we assume rg is the gate resistance formed from resistance in the portion $W_G$ to gate electrode 8. Accordingly, in this case, the gate voltage $V_{GK}$ is applied to all the gates more quicker and hence turn-on and turn-off can be effected in all the elements more exactly concurrently and therefore the switching time is more shorter. On the other hand the forward direction off-state voltage becomes larger for smaller impurity concentration of the n-type region 5, when the reverse bias gate voltage $V_{GK}$ is constant. Therefore, this has an effect that the voltage gain=$V_{AK}/|V_{GK}|$ becomes large.

Figure 3:
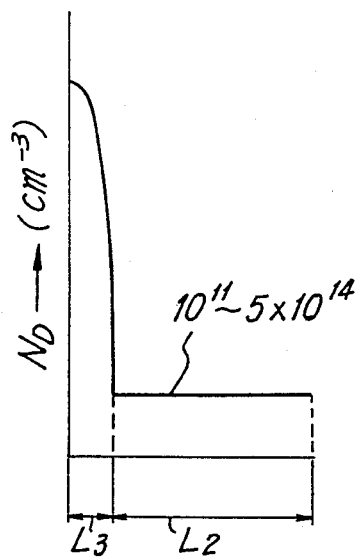
FIGS. 3, 4 and 5 are diagrams for showing impurity concentration $N_D$ in n-type region between gate and cathode.

From the above consideration, the SI thyristor according to the present invention is characterized in that the impurity concentration in the n-type region 5 is basically decided as $10^{11}$–$5 \times 10^{14}$ cm$^{-3}$ as shown in FIG. 3. Moreover, based on this recognition, as can be seen from FIG. 4, an n-type thin layer $L_4$ of middle impurity concentration may be provided at front side of the n-type low resistance region 6, and furthermore the front side thereof may be $10^{11}$–$5 \times 10^{14}$ cm$^{-3}$. The above n-type thin layer $L_4$ may have the impurity concentration of $3 \times 10^{15}$–$6 \times 10^{15}$ cm$^{-3}$ and the thickness may be 1–3 μm. The above provision of said thin layer of n-type middle impurity concentration has an effect of stably realizing the yield voltage at high value when the depletion layer may reach to the n-type low resistance region 6 at an application of reverse direction gate voltage between the gate electrode 8 and the cathode electrode 9 because the electric field concentration producing in the n-type low resistance region is mitigated. By the provision of such extent of the thin layer of n-type middle impurity concentration, an increase of ON voltage can be avoided.

It is apparent that for smaller resistance value rg of the p-type gate region 4 of the SI thyristor, the gate turn-off current increases because the turn-on and the turn-off time becomes shorter and the induced voltage due to current flowing in the gate at the time of turn-off decreases. According to this recognition, the SI thyristor according to the present invention has characterized in that the above resistance rg is decided by the relation of equation (1).

$$\text{rg}\cdot I_{GP} < V_{bi} \tag{1}$$

wherein, $I_{GP}$ is peak gate current flowing in the gate at turn-off time, and $V_{bi}$ is the diffusion potential between the gate channel.

In general $V_{bi}$ is about 0.8 V, so that by deciding $I_{GP}$, the rg can be calculated. Accordingly, by suitably selecting the impurity concentration of the p-type gate region 4, the cross-sectional area and the length $W_G$, the rg calculated by the above can be realized. By this means, the maximum turn-off current per unit channel area of over $3 \times 10^3$ A/cm$^2$ can be realized.

Embodiment of the present invention will be explained by referring to trial products.

FIGS. 1a to 2c illustrate construction of trial SI thyristors.

Figure 2B:
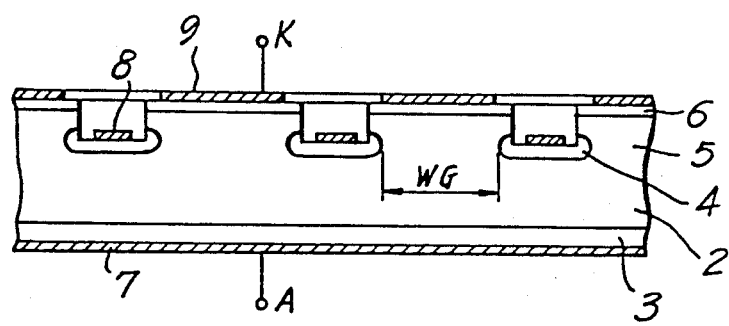
Figure 2C:
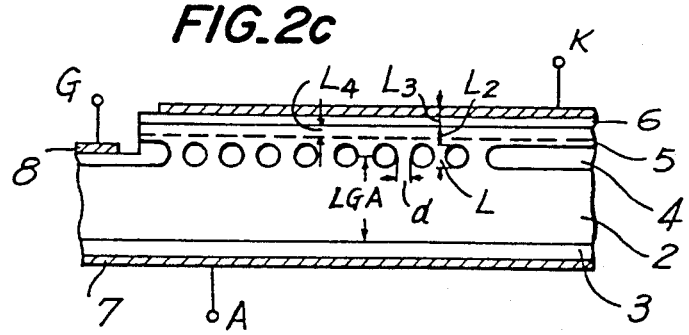

Wherein, FIGS. 1a to 1c show a small current SI thyristor, and FIGS. 2a to 2c show parallel arranged construction of said small current SI thyristors for increasing the current capacity. FIG. 2a, FIG. 2b and FIG. 2c are plan view, front view and side view of said SI thyristor, respectively.

The explanation of these drawings is nearly the same as that for FIGS. 1a to 1c.

The cell size and the effective channel area of the trial element are shown in Table 1.

TABLE 1

| Sample | I | II | III |
| --- | --- | --- | --- |
| Cell size | 3 × 5 mm$^2$ | 3 × 5 mm$^2$ | diameter 8 mm |
| Effective channel area (mm$^2$) | 3.4 × 10$^{-2}$<br>4.3 × 10$^{-2}$<br>5.6 × 10$^{-2}$ | 1.3 × 10$^{-1}$<br>1.7 × 10$^{-1}$<br>2.2 × 10$^{-1}$ | 2.5<br>3.2<br>4.2 |

The SI thyristors of the trial made can briefly be classified into 3 classes of I, II and III depending on the channel area. The sample I has its construction as shown in FIGS. 1a to 1c and the samples II and III have the construction as shown in FIGS. 2a to 2c. The impurity concentration $N_D$ in the n-type region 5 between the gate and the cathode is as follows as basically shown in FIGS. 3 and 4. The first embodiment of the present invention has its characteristics in that the impurity concentration in the n-type region 5 is $1 \times 10^{14}$–$3 \times 10^{14}$ cm$^{-3}$, and the second embodiment has its characteristics in that the impurity concentration of n-type region having thickness of 1–3 μm in front of the n-type low resistance region 6 is $3 \times 10^{15}$–$6 \times 10^{15}$ cm$^{-3}$ and further the front side thereof is made as $1 \times 10^{14}$–$3 \times 10^{14}$ cm$^{-3}$.

This second embodiment has its feature that the electric field concentration is mitigated, the yield (breakdown) voltage is high and is stabilized when reverse direction voltage is applied between the gate electrode 8 and the cathode electrode 9 and thus the depletion layer reaches to the n-type low resistance region due to presence of the middle impurity concentration region ($3 \times 10^{15}$–$6 \times 10^{15}$ cm$^{-3}$).

Figure 5:
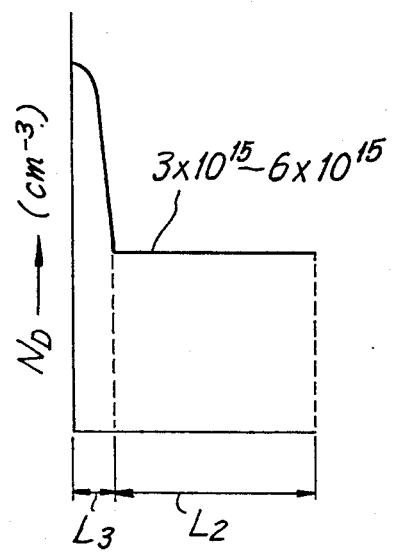

The impurity concentration in the n-type region 5 of the conventional devices is about $3$–$6 \times 10^{15}$ cm$^{-5}$ as shown in FIG. 5.

In FIG. 1c and FIG. 2c, the thickness $L_2$ of the n-type region 5 is about 10 μm, the thickness of the p-type gate region 4 and that of the silicon substrate 2 between the p-type region 4 and the p-type region 3 is about 270 μm, and the specific resistance is 250–500 Ωcm.

The resistance rg of the p-type gate region 4 is so selected that the induced voltage by the rg is at the most less than about 0.8 V by a current flowing into the gate corresponding to the main current per effective channel area of 100 A/cm$^2$ at the time of turn-off.

Manufacturing process of the above trial elements is in the following order.
(1) The p-type region 3 and the p-type gate region 4 are provided on an n-type silicon substrate by diffusion.
(2) The n-type region 5 between the gate and the cathode is provided by epitaxial growth.
(3) The n-type low resistance region 6 is provided by diffusion.
(4) The connecting portion of the gate electrode 8 is selectively etched.

(5) The metallic anode electrode 7, the gate electrode 8 and the cathode electrode 9 are connected ohmically.

Figure 4:
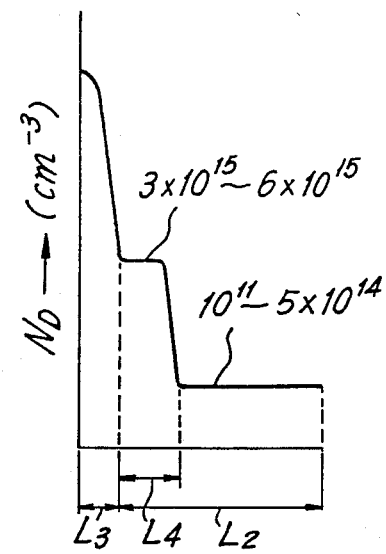

In the above process (2), usually gas phase growth of silicon is used and the impurity is phosphate, but any other method and impurity may be used as far as the impurity concentration shown in FIG. 3 or FIG. 4 can be obtained. When the low impurity concentration n-type region 5 is grown on the high impurity concentration p-type gate region 4, the grown layer may vary to p-type and the channel width may be narrowed or complete closing may occur. In order to prevent such an inconvenience, a method in which n-type impurity of comparatively high concentration is supplied at the beginning period of the growth to compensate autodoping of the p-type impurity is preferred.

Characteristics of SI thyristor according to the present invention manufactured in the aforementioned method will be explained with respect to its first and second embodiments. The ON voltage at the main current per effective channel area of 100 A/cm² is shown in Table 2. As for a reference, ON voltage of SI thyristor made in accordance with a conventional method is also indicated in the table.

TABLE 2

| Impurity concentration of n-type region | ON voltage (V) |
|---|---|
| First embodiment | 1.1–1.4 |
| Second embodiment | 1.0–1.6 |
| Conventional one | 1.8–2.6 |

As can be seen from the above result, the SI thyristors of the first and second embodiments of the present invention have lower ON voltage compared with the conventional one.

The reason of such a lowering of the ON voltage is that the SI thyristor of the present invention has the impurity concentration of $1-3\times 10^{14}$ cm$^{-3}$ in part or whole of the n-type region 5, which is relatively lower than the impurity concentration of $3-6\times 10^{15}$ cm$^{-3}$ of the conventional SI thyristors.

Figure 6A:
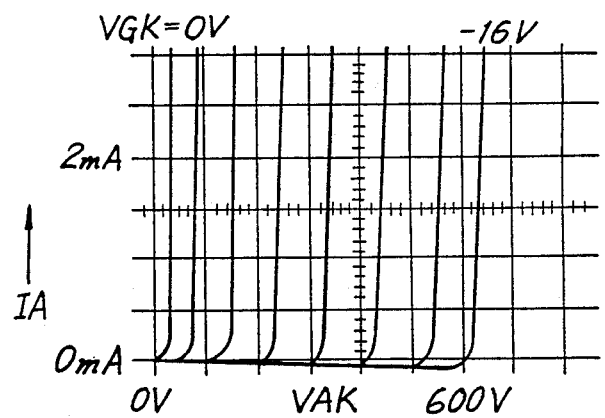
FIGS. 6a, 6b and 6c are diagrams for showing typical forward direction cut-off characteristics.
Figure 6B:
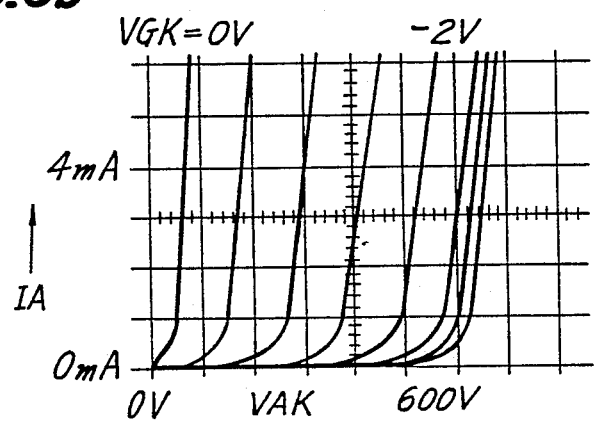
Figure 6C:
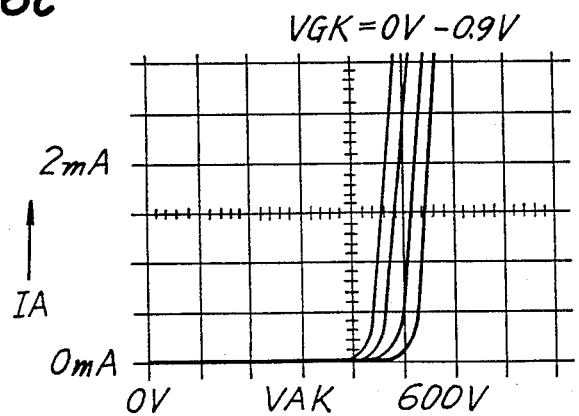

FIGS. 6a, 6b and 6c show typical forward direction off-state characteristics, in which the abscissa is the off-state voltage and the ordinate is the leakage current.

In the drawings, the parameter is the reverse bias gate voltage $V_{GK}$ between the gate and cathode, and the step is:

FIG. 6a ... $-2$ V,
FIG. 6b ... $-0.5$ V, and
FIG. 6c ... $-0.1$ V.

The voltage gain $\mu = V_{AK}/|V_{GK}|$ of these elements are:
FIG. 6a; $\mu = 610/16 = 38$,
FIG. 6b; $\mu = 570/2.8 = 200$, and
FIG. 6c; $\mu = 520/0.9 = 580$.

From the above, it should be understood that by increasing the reverse bias gate voltage $V_{GK}$, the off-state voltage increases. All the three elements have saturated off-state voltage at 500–600 V. This is caused from the fact that the depletion layer reaches to the p-type region 3 by the applied voltage of 500–600 V because the specific resistance of the silicon substrate is 250–500 Ωcm and the thickness thereof is 270 μm and which results an increase of injection of holes from the p-type region 3 and the current begins to flow.

As mentioned above, the difference in the voltage gain has been caused from the construction of the elements. Namely, the voltage gain $\mu$ increases according to the decrease of the channel width d and to the increase of the channel length L and the increase of depletion layer width $L_{GA}$ between the gate and the anode.

Figure 7:
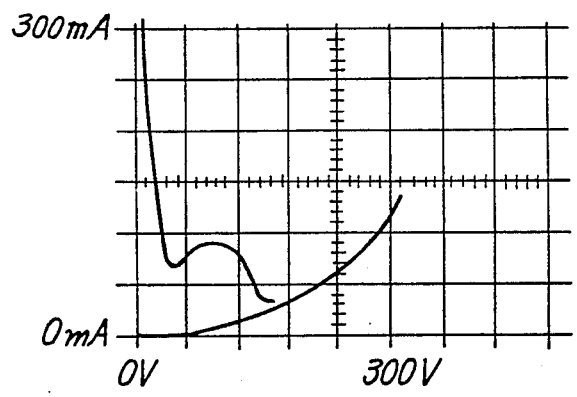
FIG. 7 is a characteristic diagram for showing a typical embodiment of the breakover characteristic.

FIG. 7 shows a typical embodiment of the breakover characteristics in which the abscissa is anode cathode voltage and the ordinate is the anode current. This corresponds to sample II and the characteristic is taken when the gate and the cathode are short circuited.

Figure 8:
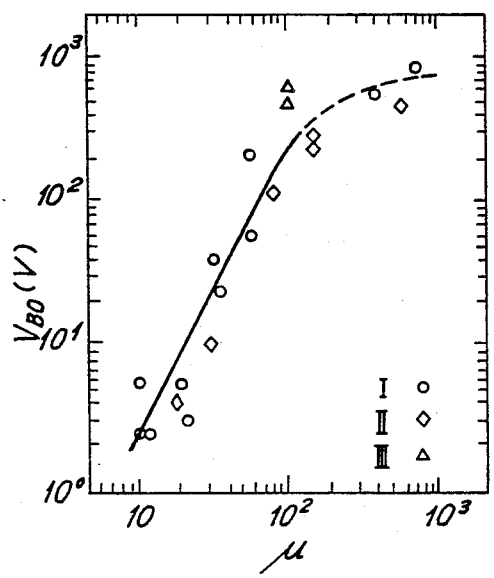
FIG. 8 is a diagram for showing the relationship between the voltage gain $\mu$ and the breakover voltage $V_{BO}$.

FIG. 8 shows a relation between the voltage gain $\mu$ and the breakover voltage.

From this diagram it can be said that the breakover voltage $V_{BO}$ is in proportion to the square of the voltage gain. The saturation of the breakover voltage over 500 V is caused from the fact that the depletion layer of n-type silicon substrate 2 reaches to the p-type region 6.

Figure 9:
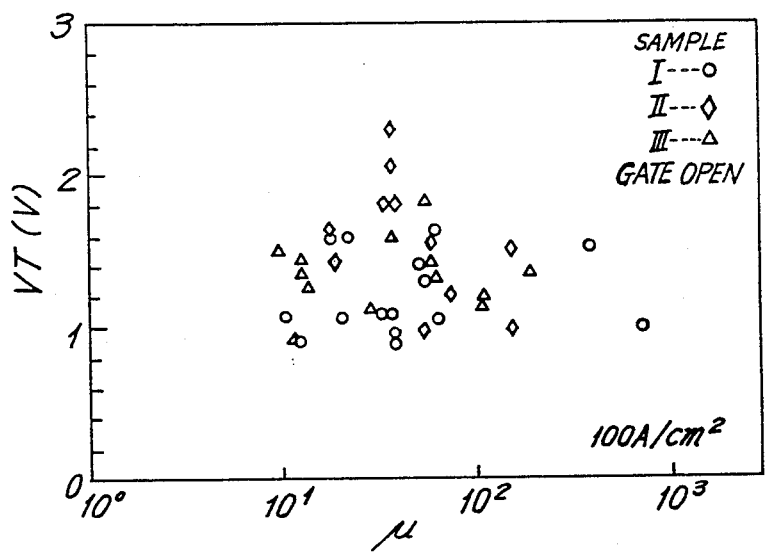
FIG. 9 is a diagram for showing the relationship between the voltage gain $\mu$ and the ON voltage.
Figure 10A:
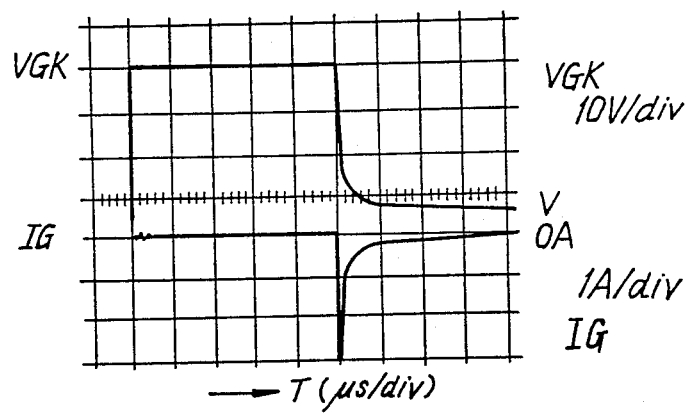
Figure 10B:
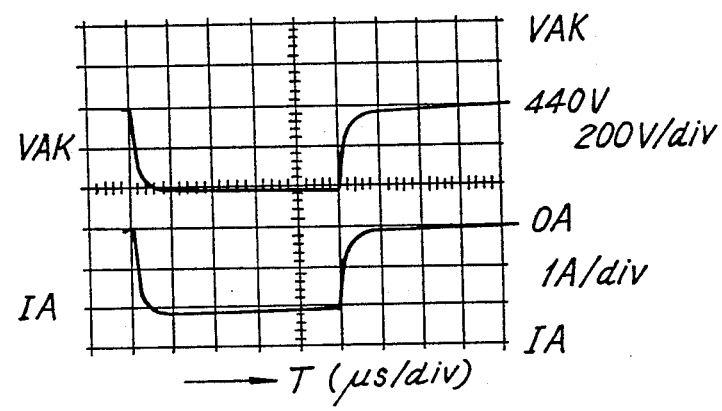

FIG. 9 shows a relation between the voltage gain $\mu$ and the ON voltage $V_T$ when the main current per effective area is 100 A/cm². The ON voltage of majority of the elements is 0.9–1.6 V and it is substantially constant at the voltage gain of 10–700.

FIGS. 10a, 10b and 11a, 11b show typical switching waveforms, in which the abscissa shows time and the ordinate represents from top thereof the gate voltage $V_{GK}$, the gate current $I_G$, the anode voltage $V_{AK}$ and the anode current $I_A$.

This is for sample II and the same sample is used for FIGS. 10 and 11. In FIG. 10, the turn-on time is 0.5 μs and the turn-off time is 1 μs. FIG. 11 shows waveform for turning off the maximum gate turn-off current at reverse bias gate voltage $V_{GK} = -45$ V.

Figure 12:
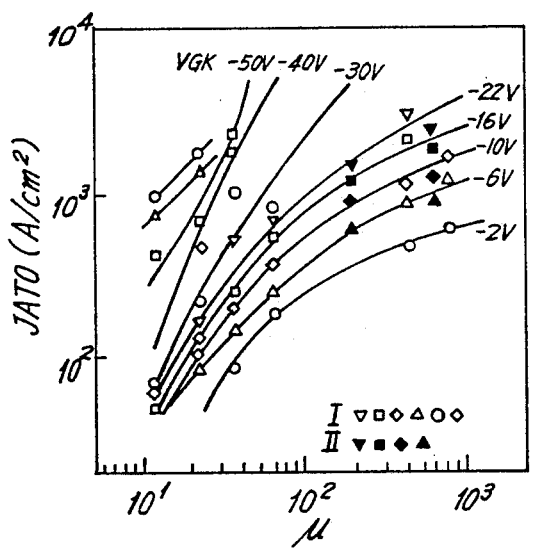
FIG. 12 is a diagram for showing the relationship between the voltage gain $\mu$ and the maximum gate turn-off current density per effective channel area $J_{ATO}$.

FIG. 12 represents a relation between the voltage gain $\mu$ and the maximum gate turn-off current concentration per effective channel $J_{ATO}$ and in which the parameter is the reverse bias gate voltage $V_{GK}$. By this it can be seen that the maximum gate turn-off current concentration $J_{ATO}$ increases according to an increase of the voltage gain $\mu$ and the reverse bias gate voltage $V_{GK}$.

Figure 13:
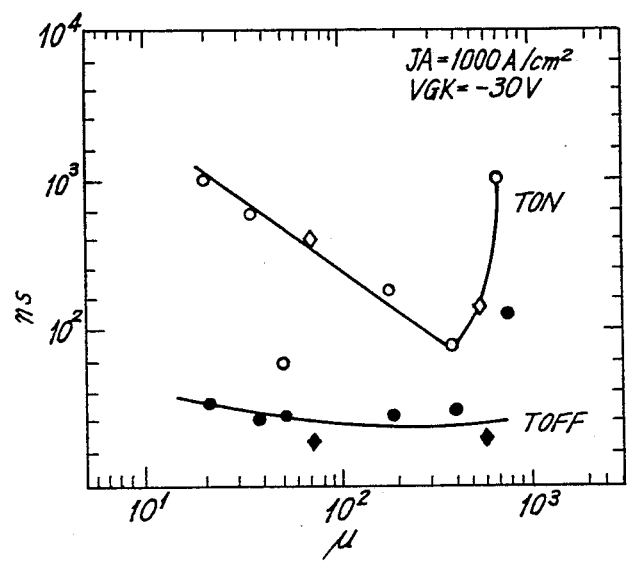
FIG. 13 is a diagram for showing the relationship between the voltage gain $\mu$ and the turn-on rising time $T_{ON}$, and the turn-off retarding time $T_{OFF}$.

FIG. 13 represents a relation between the voltage gain $\mu$ and the turn-on rising time $T_{ON}$ and the turn-off retarding time $T_{OFF}$. From this it can be understood that the elements having the voltage gain of 100–600 have comparatively high switching speed.

From the above data of the trial manufactured first and the second embodiments of the present invention it can be understood that the device has low ON voltage of 0.9–1.6 V, and the voltage gain $\mu$ can be settled comparatively high such as 100–600 and further that an improved characteristics of having relatively high switching speed at said voltage gain $\mu$ and a large gate turn-off current of over $3\times 10^3$ A/cm² can now be realized.

A third embodiment of the invention will be explained by referring to FIGS. 14 and 15 and a fourth embodiment will be explained by FIGS. 14 and 16. FIG. 14 illustrates construction of SI thyristor of the third and the fourth embodiments. The reference in the drawing represents the same as in FIG. 1b.

In both the third and fourth embodiments, an n-type low resistance region 6 in area I is provided as shown in FIG. 14 in a manner to be surrounded by an n-type region in area II, and these embodiments have the feature that the cathode electrode 9 is connected in the middle portion of the n-type low resistance region 6 except the peripheral portion hereof.

By this construction an effect that the gate-cathode reverse breakage voltage can be increased and stabilized.

This third embodiment has its feature in that the impurity concentration in the n-type region 5 is made as $10^{11}$–$5\times10^{14}$ cm$^{-3}$ as shown in FIG. 15. The regions I, II, L$_2$ and L$_3$ shown in FIG. 15 each corresponds to the same numeral of that shown in FIG. 14.

The fourth embodiment is characterized in that the impurity concentration in the n-type region 5 is made two steps of $3\times10^{15}$–$6\times10^{15}$ cm$^{-3}$ and of $10^{11}$–$5\times10^{14}$ cm$^{-3}$ as shown in FIG. 16. The thickness of the middle impurity concentration region L$_4$ of FIG. 16 can be made less than 3 μm. The regions I, II, L$_2$ and L$_3$ in FIG. 16 correspond to those of identical designation shown in FIG. 14.

The SI thyristor of the third and fourth embodiments can be manufactured in the same manner as that of the first and second embodiments. Wherein the n-type low resistance region 6 may be provided through selective diffusion of n-type impurity. As can be understood from the above, the third and the fourth embodiments are effective for realizing SI thyristor having an improved characteristics likewise with the first and the second embodiments.

Figure 17A:
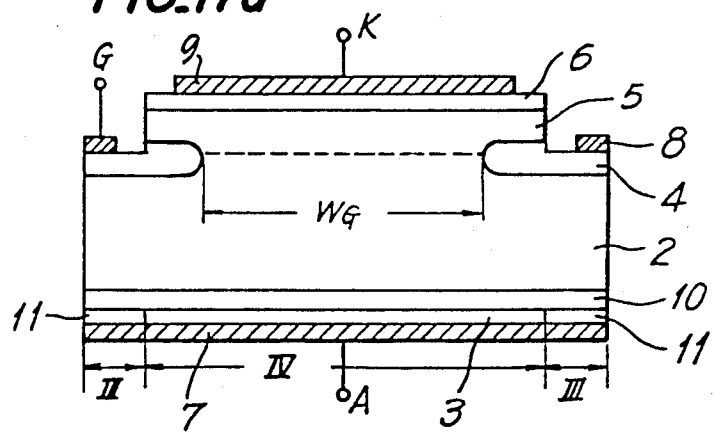
FIGS. 17a and 17b are more detailed constructional explanatory views of the same static induction thyristor of the present invention.
Figure 17B:
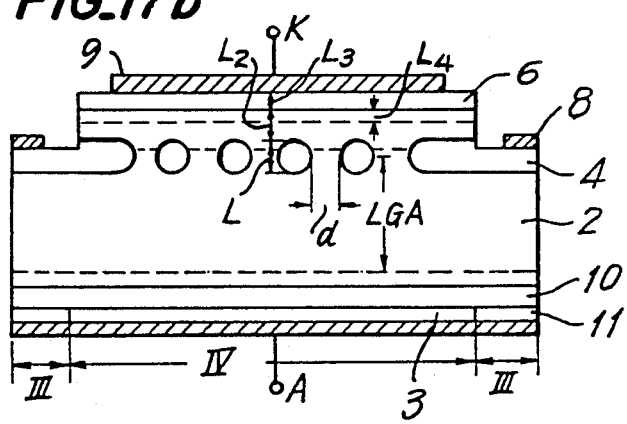

Fifth embodiment is a so called reverse conductive type (or reverse current conducting type) SI thyristor, in which the SI thyristors of the abovementioned first to fourth embodiments are made short circuited construction for p-type region 3 at the anode side, of which embodiment will be explained by referring to FIGS. 17a and 17b. FIGS. 17a and 17b show construction of making that shown in FIGS. 1b and 1c into reverse conductivity type and 10 is n-type middle resistance region and 11 is n-type low resistance region and other reference numerals in the drawing are corresponding to those in FIGS. 1b and 1c.

This fifth embodiment is characterized in that the short circuit of the p-type region 3 is effected beneath the connecting region of the gate electrode 8 as shown by region III in FIGS. 17a and 17b. The thickness of the n-type middle resistance region 10 in FIGS. 17a and 17b and the length of it indicated by a region IV and the n-type impurity concentration thereof are better to be decided by considering the following factors.

(1) The expansion of depletion layer between the gate and anode in off-state condition should not reach to the p-type region 3.
(2) The generated current in off-state condition originates from the anode electrode and flows through the n-type low resistance region 11 and across the n-type middle resistance region 10 in lateral direction in the portion IV, and in this case the generated voltage in the portion IV of the n-type middle resistance region 10 is made smaller than the diffusion potential so that the introduction of holes from p-type region 3 is suppressed.
(3) The transistor current in the off-state condition (corresponding to the wave front of the current) should not exceed the threshold leakage current in order that the element will not break by the induced heat i.e. operates stably. In order to realize this, the produced voltage in part of n-type middle resistance region 10 must exceed the diffusion voltage to accelerate the injection of holes and thus prevent the element causing break-over.

By arranging the construction of the n-type middle resistance region 10 in a range obtained by the aforementioned method, the SI thyristor has substantially pn$^-$n diode characteristics so that the breakdown voltage per unit thickness of the n-type silicon substrate 2 becomes larger which results an effect to have large forward direction off-state voltage, small leakage current and short turn-off time.

Anode side of the SI thyristor of the fifth embodiment may better be fabricated by selective diffusion of p-type region 3 and n-type low resistance region 11 after providing n-type middle resistance region 10 by epitaxy or diffusion method. The method of fabrication of various regions at cathode and the impurity concentration of the n-type region 5 may be effected in a same manner as explained in the first to fourth embodiments.

Figure 18:
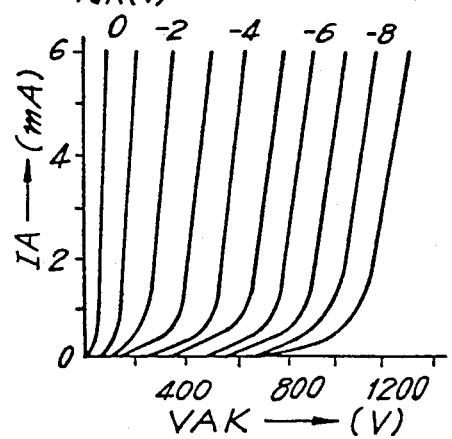
FIG. 18 is a diagram for showing one embodiment of the forward direction cut-off characteristic of the static induction thyristor.

FIG. 18 shows one embodiment of forward direction off-state characteristics of the SI thyristor of the fifth embodiment, in which the abscissa is anode voltage V$_{AK}$, ordinate is anode current I$_A$ and the parameter is taken by reverse bias gate voltage V$_{GK}$. The element used in the embodiment of FIG. 18 has specific resistance of the n-type silicon substrate 250–500 Ωcm, thickness thereof 220 μm and forward direction off-state voltage of over 1,200 V.

Sixth embodiment will be explained by referring to FIGS. 19a to 19c.

The sixth embodiment is based on the fifth embodiment but it has characteristics in that said basic embodiment is arranged in parallel and the gate electrode is provided on the surface.

FIG. 19a is a plan view, FIG. 19b is a cross-sectional view taken along line X$_1$—X$'_1$ of FIG. 19a, FIG. 19c is a cross-sectional view taken along line Y—Y of FIG. 19a, and FIG. 19d is a cross-sectional view taken along line X$_2$—X$'_2$ of FIGS. 19a and 19c.

In these figures, 12 is gate connecting region which connects the gate region 4 to the gate electrode 8, and 13 is a surface insulation layer and the other reference numerals are the same as had been explained with respect to FIGS. 17a and 17b.

In the sixth embodiment, the p-type gate connecting region 12 can be fabricated by selective diffusion method of p-type impurity like boron and others, and the surface insulating layer 13 can be fabricated by thermal oxidization of silicon film or CVD method or the like. The impurity concentration of the other regions at the cathode side and the n-type region 5 may be fabricated in the same manner with the first to fourth embodiment and also the n-type middle resistance region 10 and other regions at the anode side can be fabricated in the same manner as in the fifth embodiment.

The abovementioned SI thyristor in the sixth embodiment has effect to make the leakage current smaller at blocking condition and to shorten the turn-off time because it has large current capacity for enlarging the element area and it has characteristics in that the element area can effectively utilized without decreasing the effective channel area because p-type region 3 in the anode side is short circuited beneath the p-type gate connecting area.

As has been explained already, a larger off-state voltage can be obtained at small gate voltage according to the higher voltage gain so that an advantage is obtained in that the control circuit becomes simpler. As can be understood from the result of FIG. 9, the ON voltage of the static induction thyristor according to the present invention is substantially constant even the voltage gain varies when compared at a constant current density. In a meanwhile, the gate turn-off maximum current density J$_{ATO}$ increases with the voltage gain as can be seen from FIG. 12. When larger gate turn-off current is obtained under smaller gate voltage, the control circuit becomes simpler and an advantage in that the assembled device can be made smaller. Accordingly, when the voltage gain is too small a good device can not be reaized. As can be seen from FIG. 12, the voltage gain is desired to be at least 10 or preferably over 50.

The relation between the construction of the static induction thyristor according to the present invention and its voltage gain will now be explained. One such relation between the voltage gain and construction of inventive static induction thyristor in which a high resistance region is provided between the gate and the cathode is as shown in FIG. 20. As shown in FIG. 20, d is gate-to-gate interval, L is gate length, $L_{GA}$ is gate anode distance or more perfectly a distance from the gate and an end of the depletion layer extending toward the anode side. The voltage gain $\mu$ is given by:

$$\mu = \frac{L \times L_{GA}}{d^2} \quad (2)$$

In the forward direction off-state condition by the gate voltage, the adjacent area of the gate is depleted so that the impurity concentration will not affect substantially.

Figure 21:
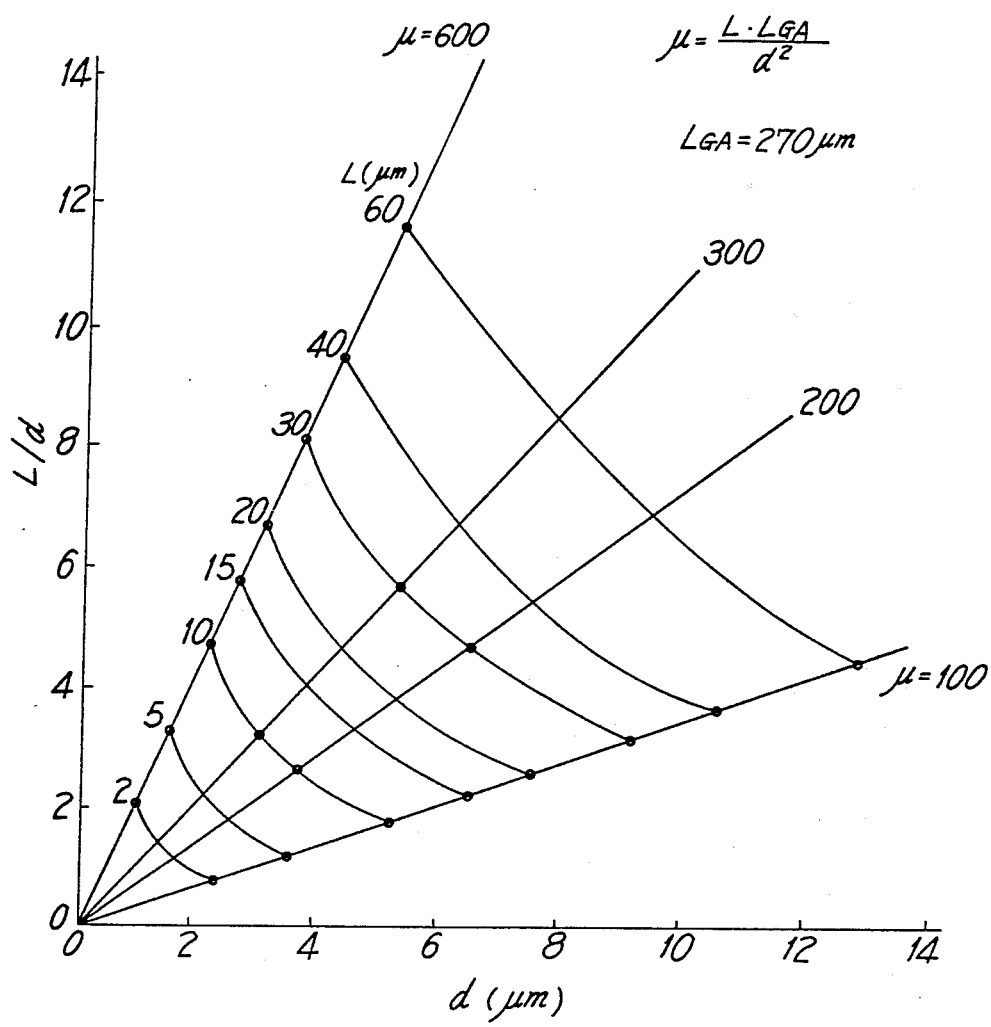
FIG. 21 is a diagram for showing the relationship between the voltage gain $\mu$ and the construction.

FIG. 21 shows a relation between L/d and d for obtaining a desired voltage gain for constant $L_{GA}$.

The voltage gain $\mu$ of the static induction thyristor of the present invention may be decided according to the equation (2).

In the foregoing the static induction thyristor had been explained with respect to buried gate construction. For the smaller gate resistance, the switching speed of the SI thyristor is faster and the gate turn-off current is larger. The smaller the gate resistance of the SI thyristor is the better the result. An embodiment by which the gate resistance can be made more smaller than that of the buried gate type SI thyristor.

Figure 24:
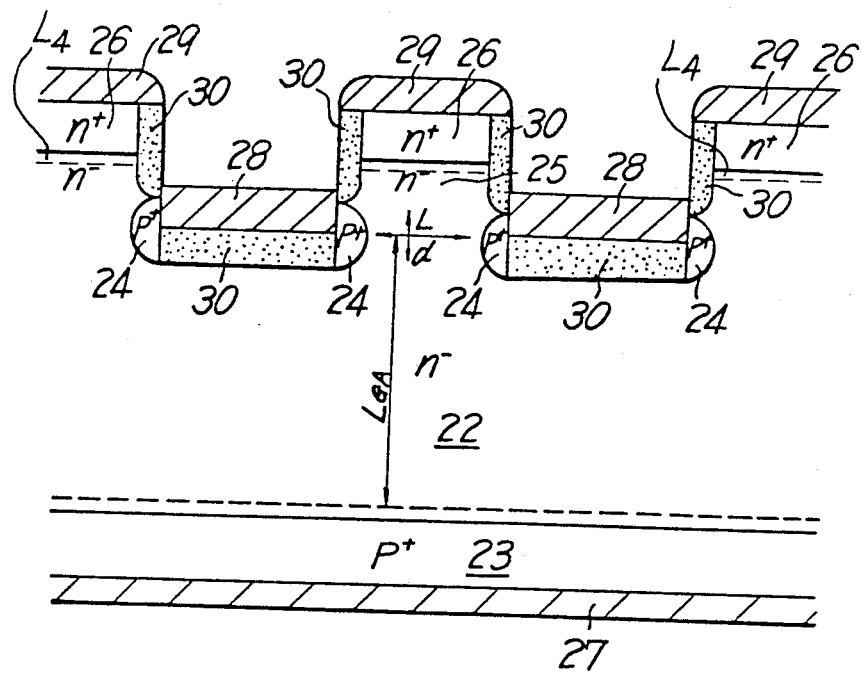

FIGS. 22 to 24 show an SI thyristor according to the present invention and having a very small gate resistance.

In FIG. 22, the gate region is provided between the buried gate region to the surface and a metal electrode is provided. Namely this is the so called buried type surface gate construction.

In FIG. 23, cut out portions are provided up to buried gate region and the metal electrodes are provided directly thereon. This type is the cut out type so that the metal electrode can be made thicker and more especially it has small gate resistance.

In the FIG. 24 construction, the difference from FIG. 23 is that the P+ gate regions 24 are provided only at the side walls of the cut out by which the gate resistance is still reduced and at the same time the gate capacitance is decreased. This construction is specially suitable for obtaining a large current gain at the time of turn-off. The voltage gain of the SI thyristor shown in FIGS. 22 to 24 is given by equation (2). The various regions will be explained by referring to FIGS. 22 to 24. p+ region 23 is the anode region, p+ region 24 is the gate region, n+ region 26 is the cathode region, 27, 28 and 29 are anode electrode, gate electrode and cathode electrode, respectively. The impurity concentration of n− region is about $5 \times 10^{14}$ cm$^{-3}$ or less. The thickness thereof is arranged to be about 2–3$\mu$ to 10–20 $\mu$m. The impurity concentration of the n− region 22 and its thickness are decided from the maximum off-state voltage.

In the above the present invention has been explained with respect to various embodiment. Now the characteristics thereof will be explained by comparing with the conventional embodiments.

Figure 25:
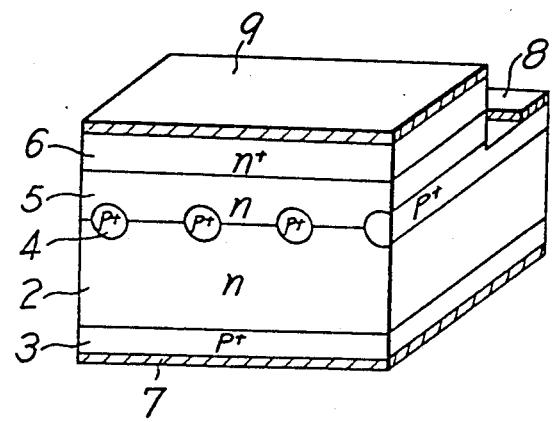
FIG. 25 is a perspective view of a conventional buried gate shown for supplemental explanation.

FIG. 25 shows a typical example of buried gate construction of the conventional n-channel SI thyristor in perspective view. In FIG. 25, n− region 2 and n− region 5 form the channel and also constitute a base of p+nn+. p+ region 3 is the anode region, n+ region 6 is the cathode region and p+ region 4 is the gate region and in general the semiconductor material is silicon. To the p+ region 3, p+ region 4 and n+ region 6, an anode electrode 7, a gate electrode 8, and a cathode electrode 9 are connected, respectively, which are formed of Aluminium (Al), Aluminium-Silicon alloy (Al-Si), Tungsten (W), Molybdenum (Mo), Gold (Au), low resistive polysilicon or the multi-layer construction thereof.

In the SI thyristor having construction of FIG. 25, it is found by experiments that for smaller gate resistance rg between the gate electrode 8 and the gate region of p+ region, the larger the gate turn-off current and also the switching speed is faster. As for instance, for the comparative value of 1 to 7 of the gate resistance, the turn-off time is 0.14$\mu$ sec and 0.27$\mu$ sec respectively and for the comparative value of 1 to 2 of the gate resistance, the gate turn-off current is 30 A and 15 A respectively.

The above experimental result is caused from the operational construction of the SI thyristor. Namely by assuming the gate to cathode junction capacity as $C_{GK}$, the smaller the gate resistance rg of p+ region, the time constant rg$C_{GK}$ decreases. Accordingly, the applied voltage $V_{GK}$ between the gate electrode 8 and the cathode electrode 9 quickly propagates to the gate region separated from the gate electrode 8 so that the turn-on occurring when positive gate voltage is applied to the gate electrode 8 and the turn-off occurring when negative gate voltage is applied are both occur more concurrently on all over the elements so that the switching speed becomes faster. For the smaller gate resistance rg of the p+ region 4, the peak value of the gate current flowing into gate region at the turn-off time is larger and from this the channel region may be pinched off by altering to the depletion layer in a more shorter time and the forward voltage applied to the anode electrode is blocked. By this the turn-off time is shortened and by the current flowing in the gate region at the time of turn-off, the produced voltage in the p+ region 4 is reduced and thus apparently the gate turn-off current is increased.

The influence of the gate resistance rg in the static induction thyristor for the turn-off process will be explained in detail.

Figure 26A:
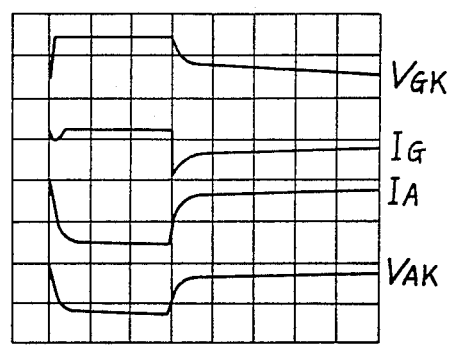
FIGS. 26a and 26b are comparison views of SI thyristor switching waveforms.
Figure 26B:
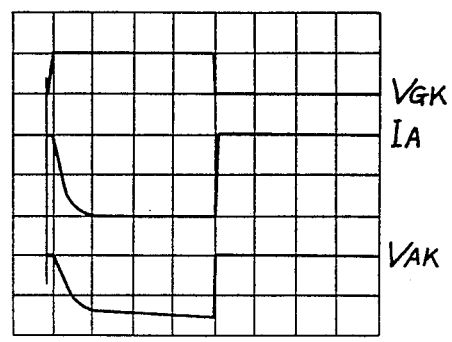

Switching waveforms of operating SI thyristors of exactly identical dimension by exactly identical driving circuits are shown in FIGS. 26a and 26b.

In FIG. 26a, the illustrated waveforms are from the top;
  gate voltage $V_{GK}$ (20 V/div)
  gate current $I_G$ (2 A/div)
  anode current $I_A$ (2 A/div)
  anode voltage $V_{AK}$ (100 V/div),
In FIG. 26b, the illustrated waveforms are from the top;
  gate voltage $V_{GK}$ (50 V/div)
  anode current $I_A$ (2 A/div)
  anode voltage $V_{AK}$ (50 V/div),
In the both figures, the abscissa is 2$\mu$ sec/div.

The direct current reverse gate bias is −30 V in the thyristor shown in FIG. 26a (termed as thyristor B) and −50 V in the thyristor shown in FIG. 26b (termed as thyristor A). The gate resistance connected in the outer gate driving circuit is 3Ω and 8Ω respectively. In the thyristor B, an accumulating effect is observed at turn-off and the anode current is not completely interrupted and it has a long trailing edge. This means that a quick turn-off is not obtained. On the other hand in the thyristor A, the gate voltage has the substantially the same waveform with the applied outer pulse and the anode current is interrupted substantially instantaneously. The turn-off time is less than $0.1\mu$ sec.

The difference in the turn-off process of these two SI thyristors is mainly depend upon the difference of the gate resistance rg. In the conducting condition of a thyristor a great number of electrons and holes injected from the cathode and the anode are present. Accordingly, in order to quickly interrupt this current, it is required to derive out the injected carrier outside as quickly as possibly. At the time of turn-off inevitably the current flows into the gate.

Figure 27A:
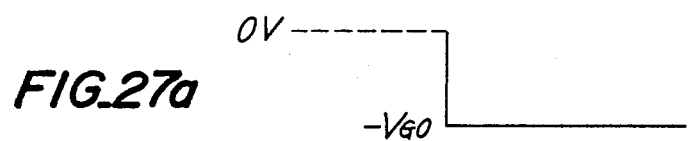
FIGS. 27a, 27b and 27c are diagrams of gate applied voltage, gate voltage and gate current, respectively of turn-off time of an SI thyristor.
Figure 27B:
Figure 27C:
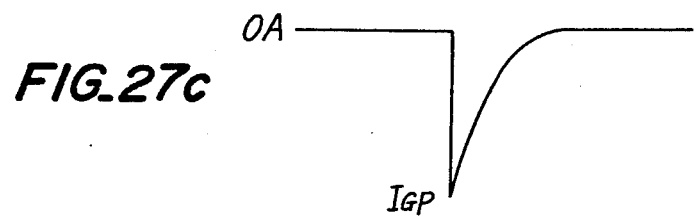

Namely, as shown in FIG. 27a, when a voltage for turning off the gate is applied, the gate voltage and the gate current vary as respectively shown in FIGS. 27b and 27c. At the time of turning off, a large current flows into the gate. When we assume this peak current as $I_{GP}$, the voltage drop rg $I_{GP}$ by the gate resistance rg should be smaller than a value about ($V_{GO}+V_{bi}$). From this the following establishes:

$$rgI_{GP} < V_{GO} + V_{bi} \quad (3)$$

wherein, $V_{bi}$ is gate to channel diffusion potential, and $-V_{GO}$ is direct current reverse bias.

Therefore, $I_{GP}$ becomes larger for smaller rg.

Figure 28:
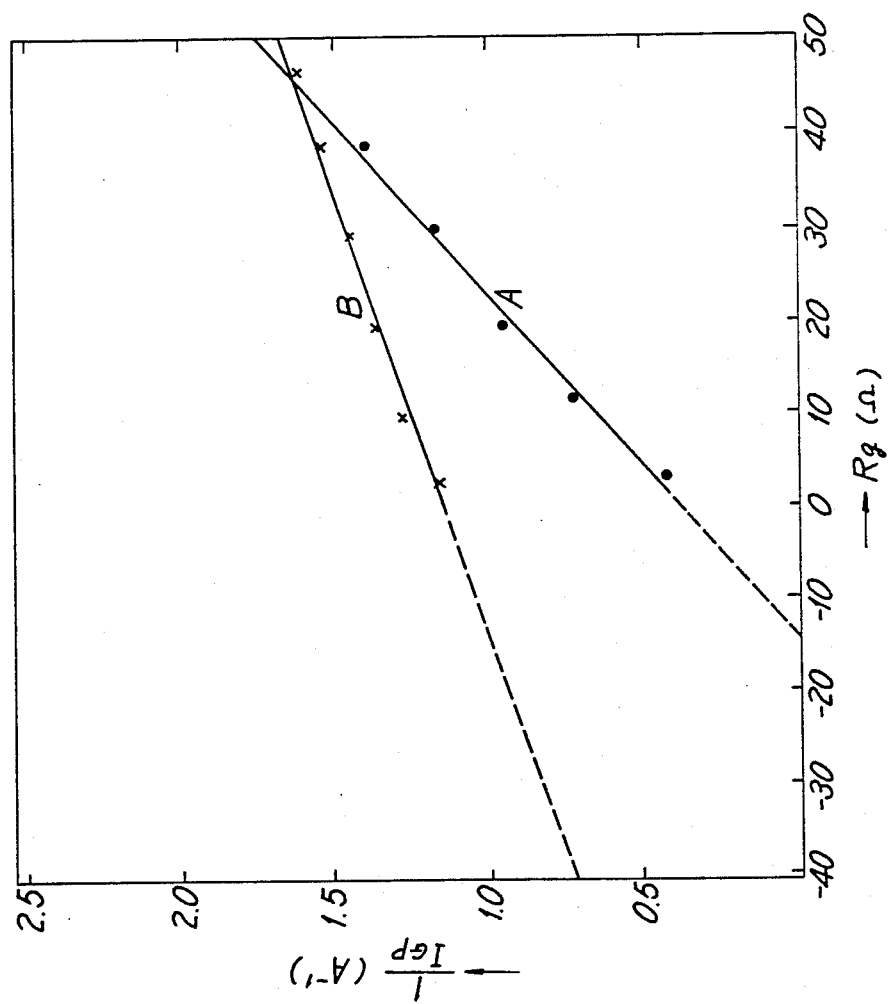
FIG. 28 is a diagram for showing the relation-ship between the peak gate current $I_{GP}$ and the outer gate resistance $R_g$ of the SI thyristor at its turn-off time.

The variation of $I_{GP}$ may be more remarkable by connecting an outer gate resistance Rg. Dependency characteristics of SI thyristors B and A shown in FIGS. 26a and 26b on the outer gate resistance Rg are shown in FIG. 28.

In this figure, the ordinate is $1/I_{GP}$, and the abscissa is Rg and the result is obtained at the anode current $I_A$ of 1 A and the load resistance $R_1$ of 120Ω. In either thyristors, $1/I_{GP}$ and Rg are in linear relationship.

Namely, the following exists.

$$I_{GP} \propto \frac{1}{rg + Rg} \quad (4)$$

By an outer interpolation of a linear line and obtaining a cross point with a line of $1/I_{GP}=0$ is the effective gate resistance rg of the SI thyristor. This value rg is 14Ω in thyristor A and 112Ω in thyristor B. This value of rg has also been confirmed by actual measurement of gate input impedance.

This result shows a fact that by making the gate resistance rg of the SI thyristor smaller, a thyristor being able to instantaneously cut out the conducting current can now be realized.

From the above it is noted that reduction of the gate resistance is effective for realizing SI thyristor having high switching speed and a large gate turn-off current which are generally requested.

On the other hand, when the gate resistance rg is large, the turning off is possible by increasing the negative gate voltage up to desired value, however a disadvantage is involved in that the controlling circuit becomes complicated and large for generating a large gate voltage. Accordingly, the gate voltage required for gate turning off is better in fabricating a device. Therefore, in the equation (3), the direct current bias is preferable to be made:

$$V_{GO} \approx 0$$

and from this, equation (5) can be obtained. This equation (5) is same as equation (1) explained in the foregoing.

$$rg \cdot I_{GP} < V_{bi} \quad (5)$$

Namely the product of the gate resistance rg and the peak gate current $I_{GP}$ is better to be smaller than the gate to channel diffusion potential $V_{bi}$.

As has been explained with referring to various examples, apparently the SI thyristor according to the present invention is not limited to the illustrated embodiments only. The conductivity type may completely be reversed. A high resistance layer may be interposed between the gate and cathode and in this case voltage gain should be large.

INDUSTRIAL APPLICABILITY

The SI thyristor according to the present invention has characteristics of very high switching speed, a small ON voltage, and a large voltage gain and the industrial applicability is very wide.

We claim:

1. A static induction thyristor, comprising a high resistance semiconductor substrate (2) of one conductivity type, a low resistance anode region (3) of the other conductivity type on one main surface of said substrate, a gridlike, low resistance gate region (4) of said other conductivity type buried in the opposite surface of said substrate, and having the same impurity concentration with that of the anode region (3) and made by a same diffusion step, a high resistance and relatively low doped region (5) of said one conductivity type over said gate region (4) including a middle resistance region ($L_4$) having a substantially homogeneous impurity concentration in the range $3 \times 10^{15}$ to $6 \times 10^{15}$ cm$^{-3}$ interposed between the high resistance region (5) and a cathode region and having a thickness of one to three microns, and a low resistance cathode region (6) of said one conductivity type over said high resistance region (5), and respective anode, gate, and cathode electrodes (7), (8) and (9) each connected respectively with the exposed portions of said anode region (3), gate region (4), and cathode region (6), wherein forward direction anode voltage may be applied between said anode and cathode electrodes, and a reverse direction gate voltage may be applied between said gate and cathode electrodes, the thyristor including (a) said high resistance region (5) having an effective impurity concentration in the range of $10^{11}$ to $5 \times 10^{14}$ cm$^{-3}$; and (b) a gate having its size which satisfies the voltage gain ($\mu$) relationship:

$$\mu = L \cdot L_{GA}/d^2 > 10$$

where L is the diameter or length of said gate,
d is the interval between adjacent gates,
$L_{GA}$ is the depth of a depletion layer between the gate region (4) and the anode region (3), wherein the static induction thyristor satisfies either of the following formulae at the turn-off operation;

$$rgI_{GP} < V_{GO} + V_{bi}$$

and $$rgI_{GP} < V_{bi}.$$

2. A static induction thyristor as claimed in claim 1, having a voltage gain of 100 or more.

3. A static induction thyristor as claimed in claim 2, wherein said cathode region (6) is connected to a part of said middle resistance region ($L_4$).

4. A static induction thyristor as claimed in claim 1, wherein said cathode region (6) is connected to a part of said middle resistance region ($L_4$).

5. A static induction thyristor as claimed in claim 1, wherein the anode region (3) is provided on a part of said one main surface of the substrate (2), and a low resistance cathode region (11) of said one conductivity type is provided at another part of said one main surface of the substrate.

6. A static induction thyristor as claimed in claim 1, wherein said gate regions (24) are cut into the substrate (22) having exposed bottom and sidewalls to form a buried gate region, with an oxide (30) formed onto the substrate on said bottom and sidewalls, an electrode (28) formed over said bottom oxide and said gate region formed between the edges of said bottom oxide and said electrode and said substrate.

7. A static induction thyristor as claimed in claim 1, wherein said high resistance region has a thickness of about ten microns and $L_{GA}$ has a thickness of about two-hundred seventy microns.

8. A reverse conductive type static induction thyristor, comprising a high resistance semiconductor substrate (2) of one conductivity type, a middle resistance region (10) of the one conductivity type on one main surface of said substrate, a low resistance anode region (3) of the other conductivity type on the middle resistance region surrounded by a low resistance region (11) of the one conductivity type on the middle resistance region, a grid-like, low resistance gate region (4) of said other conductivity type buried in the opposite surface of said substrate, and having the same impurity concentration with that of the anode region (3) and made by a same diffusion step, a high resistance and relatively low doped region (5) of said one conductivity type over said gate region (4) including a middle resistance region ($L_4$) having a substantially homogeneous impurity concentration in the range $3 \times 10^{15}$ to $6 \times 10^{15}$ cm$^{-3}$ interposed between the high resistance region (5) and a cathode region and having a thickness of one to three microns, and a low resistance cathode region (6) of said one conductivity type over said high resistance region (5), and respective anode, gate, and cathode electrodes (7), (8) and (9) each connected respectively with the exposed portions of said anode region (3), gate region (4), and cathode region (6), said gate and cathode electrodes (8) and (9) being substantially planar with one another and said gate electrode (8) connected to said gate region (4) by a gate connecting region (12) wherein forward direction anode voltage may be applied between said anode and cathode electrodes, and a reverse direction gate voltage may be applied between said gate and cathode electrodes, the thyristor including (a) said high resistance region (5) having an effective impurity concentration in the range of $10^{11}$ to $5 \times 10^{14}$ cm$^{-3}$; and (b) a gate having its size which satisfies the voltage gain ($\mu$) relationship:

$$\mu = L \cdot L_{GA}/d^2 > 10$$

where L is the diameter or length of said gate,
d is the interval between adjacent gates,
$L_{GA}$ is the depth of a depletion layer between the gate region (4) and the anode region (3),
wherein the static induction thyristor satisfies either of the following formulae at the turn-off operation;

$$rgI_{GP} < V_{GO} + V_{bi}$$

and $$rgI_{GP} < V_{bi}.$$

9. A static induction thyristor as claimed in claim 8, having a voltage gain of 100 or more.

10. A static induction thyristor as claimed in claim 9, wherein said cathode region (6) is connected to a part of said middle resistance region ($L_4$).

11. A static induction thyristor as claimed in claim 8, wherein said cathode region (6) is connected to a part of said middle resistance region ($L_4$).

12. A static induction thyristor as claimed in claim 8, wherein the anode region (3) is provided on a part of said one main surface of the substrate (2), and a low resistance cathode region (11) of said one conductivity type is provided at another part of said one main surface of the substrate.

13. A static induction thyristor as claimed in claim 8, wherein said gate regions (24) are cut into the substrate (22) having exposed bottom and sidewalls to form a buried gate region, with an oxide (30) formed onto the substrate on said bottom and sidewalls, an electrode (28) formed over said bottom oxide and said gate region formed between the edges of said bottom oxide and said electrode and said substrate.

14. A static induction thyristor as claimed in claim 8, wherein said high resistance region has a thickness of about ten microns and $L_{GA}$ has a thickness of about two-hundred seventy microns.

15. A static induction thyristor having a surface gate construction, comprising a high resistance semiconductor substrate (22) of one conductivity type, a low resistance anode region (23) of the other conductivity type on one main surface of said substrate, a grid-like, low resistance gate region (24) of said other conductivity type buried in the opposite surface of said substrate, and having the same impurity concentration with that of the anode region (23) and made by a same diffusion step, a high resistance and relatively low doped region (25) of said one conductivity type over said gate region (24) including a middle resistance region ($L_4$) having a substantially homogeneous impurity concentration in the range $3 \times 10^{15}$ to $6 \times 10^{15}$ cm$^{-3}$ interposed between the high resistance region (25) and a low resistance cathode region (26) of said one conductivity type over portions of said high resistance region (25), and respective anode, gate, and cathode electrodes (27), (28) and (29) each connected respectively with the exposed portions of said anode region (23), gate region (24), and cathode region (26), said gate and cathode electrodes (28) and

(29) being substantially planar with one another, separated by oxide regions (30) wherein forward direction anode voltage may be applied between said anode and cathode electrodes, and a reverse direction gate voltage may be applied between said gate and cathode electrodes, the thyristor including
(a) said high resistance region (5) having an effective impurity concentration in the range of $10^{11}$ to $5 \times 10^{14}$ cm$^{-3}$; and
(b) a gate having its size which satisfies the voltage gain ($\mu$) relationship:

$$\mu = L \cdot L_{GA}/d^2 > 10$$

where L is the diameter or length of said gate,
d is the interval between adjacent gates,
$L_{GA}$ is the depth of a depletion layer between the gate region (4) and the anode region (3),
wherein the static induction thyristor satisfies either of the following formulae at the turn-off operation;

$$r_g I_{GP} < V_{GO} + V_{bi}$$

and $$r_g I_{GP} < V_{bi}.$$

16. A static induction thyristor as claimed in claim 15, having a voltage gain of 100 or more.

17. A static induction thyristor as claimed in claim 16, wherein said cathode region (26) is connected to a part of said middle resistance region ($L_4$).

18. A static induction thyristor as claimed in claim 15, wherein said cathode region (26) is connected to a part of said middle resistance region ($L_4$).

19. A static induction thyristor as claimed in claim 15, wherein the anode region (23) is provided on a part of said one main surface of the substrate (22), and a low resistance cathode region (11) of said one conductivity type is provided at another part of said one main surface of the substrate.

20. A static induction thyristor as claimed in claim 15, wherein said high resistance region has a thickness of about ten microns and $L_{GA}$ has a thickness of about two-hundred seventy microns.

21. A static induction thyristor having a surface gate construction, comprising a high resistance semiconductor substrate (22) of one conductivity type, a low resistance anode region (23) of the other conductivity type on one main surface of said substrate, a grid-like, low resistance gate region (24) of said other conductivity type buried in the opposite surface of said substrate, and having the same impurity concentration with that of the anode region (23) and made by a same diffusion step, a high resistance and relatively low doped region (25) of said one conductivity type over said gate region (24) including a middle resistance region ($L_4$) having a substantially homogeneous impurity concentration in the range $3 \times 10^{15}$ to $6 \times 10^{15}$ cm$^{-3}$ interposed between the high resistance region (25) and a low resistance cathode region (26) of said one conductivity type over portions of said high resistance region (25), and respective anode, gate, and cathode electrodes (27), (28) and (29) each connected respectively with the exposed portions of said anode region (23), gate region (24), and cathode region (26), said gate regions (24) are cut into the substrate (22) having exposed bottom and sidewalls to form a buried gate region on said bottom, with an oxide (30) formed onto the substrate on said sidewalls, an electrode (28) formed over said bottom gate region formed between the sidewall oxide wherein forward direction anode voltage may be applied between said anode and cathode electrodes, and a reverse direction gate voltage may be applied between said gate and cathode electrodes, the thyristor including
(a) said high resistance region (5) having an effective impurity concentration in the range of $10^{11}$ to $5 \times 10^{14}$ cm$^{-3}$; and
(b) a gate having its size which satisfies the voltage gain ($\mu$) relationship:

$$\mu = L \cdot L_{GA}/d^2 > 10$$

where L is the diameter or length of said gate,
d is the interval between adjacent gates,
$L_{GA}$ is the depth of a depletion layer between the gate region (4) and the anode region (3),
wherein the static induction thyristor satisfies either of the following formulae at the turn-off operation;

$$r_g I_{GP} < V_{GO} + V_{bi}$$

and $$r_g I_{GP} < V_{bi}.$$

22. A static induction thyristor as claimed in claim 21, having a voltage gain of 100 or more.

23. A static induction thyristor as claimed in claim 22, wherein said cathode region (26) is connected to a part of said middle resistance region ($L_4$).

24. A static induction thyristor as claimed in claim 21, wherein said cathode region (26) is connected to a part of said middle resistance region ($L_4$).

25. A static induction thyristor as claimed in claim 21, wherein the anode region (23) is provided on a part of said one main surface of the substrate (22), and a low resistance cathode region (11) of said one conductivity type is provided at another part of said one main surface of the substrate.

26. A static induction thyristor as claimed in claim 21, wherein said high resistance region has a thickness of about ten microns and $L_{GA}$ has a thickness of about two-hundred seventy microns.

27. A static induction thyristor having a surface gate construction, comprising a high resistance semiconductor substrate (22) of one conductivity type, a low resistance anode region (23) of the other conductivity type on one main surface of said substrate, a grid-like, low resistance gate region (24) of said other conductivity type buried in the opposite surface of said substrate, and having the same impurity concentration with that of the anode region (23) and made by a same diffusion step, a high resistance and relatively low doped region (25) of said one conductivity type over said gate region (24) including a middle resistance region ($L_4$) having a substantially homogeneous impurity concentration in the range $3 \times 10^{15}$ to $6 \times 10^{15}$ cm$^{-3}$ interposed between the high resistance region (25), and a low resistance cathode region (26) of said one conductivity type over portions of said high resistance region (25), and respective anode, gate, and cathode electrodes (27), (28) and (29) each connected respectively with the exposed portions of said anode region (23), gate region (24), and cathode region (26), said gate regions (24) are cut into the substrate (22) having exposed bottom and sidewalls to form a buried gate region, with an oxide (30) formed onto the substrate on said bottom and sidewalls, an electrode (28)

formed over said bottom oxide and said gate region formed between the edges of said bottom oxide and said electrode and said substrate wherein forward direction anode voltage may be applied between said anode and cathode electrodes, and a reverse direction gate voltage may be applied between said gate and cathode electrodes, the thyristor including
(a) said high resistance region (5) having an effective impurity concentration in the range of $10^{11}$ to $5 \times 10^{14}$ cm$^{-3}$; and
(b) a gate having its size which satisfies the voltage gain ($\mu$) relationship:

$$\mu = L \cdot L_{GA}/d^2 > 10$$

where L is the diameter or length of said gate,
d is the interval between adjacent gates,
$L_{GA}$ is the depth of a depletion layer between the gate region (4) and the anode region (3),
wherein the static induction thyristor satisfies either of the following formulae at the turn-off operation;

$$rgI_{GP} < V_{GO} + V_{bi}$$

and $$rgI_{GP} < V_{bi}.$$

28. A static induction thyristor as claimed in claim 27, having a voltage gain of 100 or more.

29. A static induction thyristor as claimed in claim 28, wherein said cathode region (26) is connected to a part of said middle resistance region ($L_4$).

30. A static induction thyristor as claimed in claim 27, wherein said cathode region (26) is connected to a part of said middle resistance region ($L_4$).

31. A static induction thyristor as claimed in claim 27, wherein the anode region (23) is provided on a part of said one main surface of the substrate (22), and a low resistance cathode region (11) of said one conductivity type is provided at another part of said one main surface of the substrate.

32. A static induction thyristor as claimed in claim 27, wherein said high resistance region has a thickness of about ten microns and $L_{GA}$ has a thickness of about two-hundred seventy microns.

* * * * *